United States Patent
Nguyen Hoang et al.

(10) Patent No.: US 8,471,565 B2
(45) Date of Patent: Jun. 25, 2013

(54) SYSTEM AND METHOD FOR OUTPUT FLUX MEASUREMENT OF LIGHT EMITTING DIODE

(75) Inventors: Viet Nguyen Hoang, Leuven (BE); Pascal Bancken, Opwijk (BE); Radu Surdeanu, Roosbeek (BE)

(73) Assignee: NXP B.V., Eindhoven (NL)

( * ) Notice: Subject to any disclaimer, the term of this patent is extended or adjusted under 35 U.S.C. 154(b) by 333 days.

(21) Appl. No.: 12/876,063

(22) Filed: Sep. 3, 2010

(65) Prior Publication Data

US 2011/0080113 A1 Apr. 7, 2011

(30) Foreign Application Priority Data

Sep. 7, 2009 (EP) .................................... 09169653

(51) Int. Cl.
*G01R 31/00* (2006.01)
(52) U.S. Cl.
USPC ...... 324/414; 324/537; 324/500; 324/754.07; 315/209 R; 315/307; 315/299; 374/178; 374/183; 374/1
(58) Field of Classification Search
USPC .............................................. 324/414, 762.07
See application file for complete search history.

(56) References Cited

U.S. PATENT DOCUMENTS

| | | | | |
|---|---|---|---|---|
| 3,100,264 A | * | 8/1963 | Jaffe et al. ................... | 250/203.6 |
| 7,277,170 B2 | * | 10/2007 | Fretel et al. ................... | 356/326 |
| 8,075,182 B2 | * | 12/2011 | Dai et al. ...................... | 374/178 |
| 8,278,831 B2 | * | 10/2012 | Hoogzaad et al. .......... | 315/209 R |
| 2004/0056608 A1 | * | 3/2004 | Dietz et al. .................. | 315/241 P |
| 2006/0028155 A1 | * | 2/2006 | Young ........................... | 315/308 |
| 2006/0044795 A1 | * | 3/2006 | Tatsuno ........................ | 362/231 |
| 2008/0011229 A1 | * | 1/2008 | Takahashi et al. ............ | 118/710 |
| 2008/0297791 A1 | * | 12/2008 | Imura ............................ | 356/306 |
| 2009/0154525 A1 | * | 6/2009 | Dai et al. ...................... | 374/178 |
| 2010/0066375 A1 | * | 3/2010 | Hente et al. ................... | 324/414 |
| 2010/0194300 A1 | * | 8/2010 | Loo et al. .................. | 315/209 R |
| 2010/0327872 A1 | * | 12/2010 | Chen et al. .................... | 324/414 |

FOREIGN PATENT DOCUMENTS

| | | | |
|---|---|---|---|
| TW | 200821574 | * | 5/2008 |
| WO | 2009/044340 A2 | | 4/2009 |
| WO | 2009/095853 | | 8/2009 |
| WO | 2009/095854 | | 8/2009 |

OTHER PUBLICATIONS

B. Siegal: 'Practical Considerations in High Power LED Junction Temperature Measurement,' Electronics Manufacturing and Technology 31$^{st}$ International Conf. on IEEE, pp. 62-66, (Nov. 8, 2007).
European Extended Search Report for Patent Appln. No. EP09169653.4 (Aug. 6, 2010).

* cited by examiner

*Primary Examiner* — Arleen M Vazquez
*Assistant Examiner* — Thang Le

(57) ABSTRACT

A method of estimating the output light flux of a light emitting diode, comprises applying a drive current waveform to the LED over a period of time comprising a testing period. The forward voltage across the LED is monitored during the testing period, and the output light flux is estimated as a function of changes in the forward voltage.

7 Claims, 6 Drawing Sheets

SYSTEM AND METHOD FOR OUTPUT FLUX MEASUREMENT OF LIGHT EMITTING DIODE

This application claims the priority of European patent application no. 09169653.4, filed on Sep. 7, 2009, the contents of which are incorporated by reference herein.

FIELD OF THE INVENTION

This invention relates to lighting devices using light emitting diodes (LEDs), and particularly to the control of such devices using feedback which takes account of the LED performance.

BACKGROUND OF THE INVENTION

Lighting using solid-state devices such as LEDs is gaining momentum. The use of LEDs for lighting has several advantages over the use of conventional light sources, including high efficacy (lumen per watt), small form factor and durability. It is reported that the average lifetime of an LED is approximately 50000 hours instead of 2000 hours of an incandescent light bulb. As a result, LEDs are the preferred light source in difficult-to-replace lighting fixtures (street lights, traffic signal lights) and/or in fixtures that require higher reliability (automotive light) for safety reasons.

Despite the fact that LEDs have a long life time, like many other light sources, the light output from a LED decays over time (by an aging process). This ultimately leads to LED failure. It has been suggested that an LED with a light output level at 70% of its pristine value needs to be replaced.

Depending on the operating conditions of the LED, the time that it needs to be replaced varies greatly. Currently, light sources including LEDs are replaced according to a fixed schedule. In this manner, some of the lights are still operational and are discarded. It can also happen that a light source is burnt out before its next scheduled maintenance. Evidently maintenance according to a fixed schedule is not the best solution for lighting fixtures especially for those at difficult to reach places and if safety (or cost) is of concern.

Knowing the LED light output flux in comparison with its pristine value is desirable for making the maintenance schedule for LED fixtures, and for controlling the LED light output as well as colour (in the case of a cluster of different colour LEDs).

LED light output is conventionally monitored and measured by an external optical sensor such as a photodiode. This method is robust but has a few disadvantages. First of all, there is a need for an external sensor and wirings to this sensor. This adds to the overall cost of the system. Secondly, if an LED lighting system consists of more than one LED, multiple sensors or a time sharing mechanism between the sensor and the LEDs needs to be in place. In the case of multiple LEDs sharing one sensor, the performance requirements on the sensor is usually very high in term of speed, accuracy and the dynamic range.

In addition, the signal processing circuitry connected to the sensor must also be of high performance and therefore of higher cost. Using an external optical sensor to quantify LED flux output can be rather accurate under ideal lighting conditions i.e. without interference from other light sources. However, inaccuracy can arise in non-ideal lighting conditions. Finally, deterioration of the optical sensor and of the light path between the sensor and the LED can also contribute to the inaccuracy of the method.

There is therefore a need for a method to estimate the output flux of a LED without needing the use of an optical sensor. Most of the issues with existing LED light output monitoring/measuring methods as described above could then be overcome.

SUMMARY OF THE INVENTION

According to the invention, there is provided a method of estimating the output light flux of a light emitting diode, comprising:

applying a drive current waveform to the LED over a period of time comprising a testing period;

monitoring the forward voltage across the LED during the testing period; and estimating the output light flux as a function of changes in the forward voltage.

This method makes use of the electrical properties of the LED in order to provide an estimation of the output flux. In particular, the way the forward voltage responds to current stressing of the LED is found to differ as the LED ages. Thus, measurements of the evolution of this voltage can be used to provide an estimation of the changes in output flux.

The invention enables the light flux to be estimated at any time, without using an external optical sensor. This allows the LED performance to be monitored and controlled with a less complex system in terms of number of components and wiring, which ultimately will result in cost savings.

The method can further comprise determining the output light flux before ageing, and using this in the estimation of the output light flux as a function of changes in the forward voltage. Thus, the initial characteristics of the LED are taken into account, and the forward voltage monitoring provides an incremental analysis of the change in LED characteristics.

Preferably, the electrical power applied to the LED during the testing period is determined, and this is also used in the estimation of the output light flux as a function of changes in the forward voltage.

The drive current waveform can comprise a relatively high current portion for current stressing the LED and a relatively low measurement current portion, wherein the forward voltage is monitored during the relatively low measurement current portion.

This method uses measurement current pulses for driving the LED with a low non-zero current. This allows the LED analysis to take place while the LED is in operation. The low measurement current pulses are alternated (in a square wave pulse sequence) with high current LED drive pulses.

The forward voltage is measured at the beginning of the measurement current portion, after the end of the relatively high current portion, and subsequently when the forward voltage has stabilised during the measurement current portion.

In one example, the estimated output light flux is determined as $$\Phi_{age} = \Phi_{pristine} \cdot \frac{P_{light\_age}}{P_{light\_pristine}} \qquad (i)$$

wherein $\Phi_{age}$ is the output flux after ageing, $\Phi_{pristine}$ is the output flux before ageing, $P_{light\_age}$ is the power supplied to the LED after ageing which results in light output rather than heating and $P_{light\_pristine}$ is the power supplied to the LED before ageing which results in light output rather than heating, and wherein $P_{light\_age}$ is obtained from:

$$P_{light\_age} = P_{in\_age} - P_{heat\_pristine} \cdot \frac{\Delta V_{f\_age}}{\Delta V_{f\_pristine}} \qquad (ii)$$

wherein $P_{in\text{-}age}$ the total input power, $P_{heat\_pristine}$ is the power supplied to the LED before ageing which results in heating rather than light, $\Delta V_{f\_age}$ is the difference in measured forward voltage before and after the relatively high current portion and after ageing, and $\Delta V_{f\_pristine}$ is the difference in measured forward voltage before and after the relatively high current portion and before ageing.

In this approach, the LED is driven with current pulses with two different current amplitudes greater than zero, and the response of the forward voltage of the LED over time is measured. From this data, the amount of power that heats up the LED can be calculated. Using the law of energy conservation the amount of power that turns into light within the LED is calculated ($P_{light} = P_{in} - P_{heat}$) and therefore the light output flux of the LED.

The measurement current portion is for example less than or equal to 1 mA. The drive current waveform can comprise a square wave which toggles between the relatively high and low current values. The low current is held as long as necessary so that the forward voltage drop at the low current has stabilised. The change in the forward voltage over time can be monitored to determine when it has stabilised.

The invention also provides a system for estimating the junction temperature of a light emitting diode, comprising:

means for applying a drive current waveform to the LED over a period of time comprising a testing period;

means for monitoring the forward voltage across the LED during the testing period; and means for estimating the output light flux as a function of changes in the forward voltage.

BRIEF DESCRIPTION OF THE DRAWINGS

Examples of the invention will now be described with reference to the accompanying drawings, in which.

DETAILED DESCRIPTION OF THE EMBODIMENTS

The invention is based on the recognition that the performance of an LED can be determined based on its response to a current pulse, and in particular the amount of LED junction temperature increase due to the current pulse. The effect of this temperature increase can be determined from electrical analysis of the LED performance, without requiring external sensors. In particular, the invention is based on the recognition that analysis of the forward voltage can enable the output flux to be determined.

This amount of temperature increase is proportional to the amount of power needed to heat up the LED. Knowing the total input power to the LED and based on the energy conservation law, the amount of power that turns into light within the LED can be calculated, which in turn is proportional to the light flux output of the LED at the moment the measurement takes place. At different moments during the life time of a LED, the output flux and its relation to the pristine value of the LED can be calculated.

Figure 1:
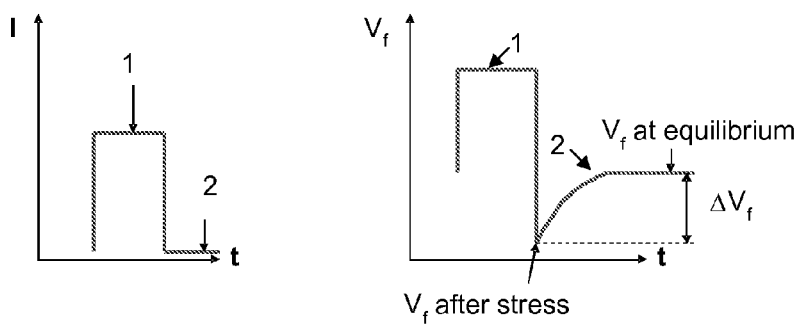
FIG. 1 shows the response of an LED forward voltage in response to current stressing, to explain the approach of the invention.

FIG. 1 illustrates a current pulse 1 and the response to the current pulse of the LED, in terms of the forward voltage 2 over time. The current pulse needs to induce a noticeable temperature rise, which will depend on the size of the LED and the thermal capacitance of the system connected to the LED. The stress pulse may have a duration of seconds, for example 1 to 30 seconds, or more preferably 5 to 20 seconds. The current may be of the order of amps, for example 0.5 to 10 A. For example, a 2.25 A pulse of 10 s duration can be used.

The left plot shows the response for a new LED whereas the right plot shows the response for an aged LED. The aged LED experience a greater rise in forward voltage in response to a current pulse, and this reflects increased heating. This link between the forward voltage and the heating of the LED junction forms the basis of a system recently devised by the applicant for measuring the junction temperature of an LED without requiring a dedicated sensor—instead the electrical characteristics of the LED can be used.

The junction temperature measurement system is described in WO 2009/095853 (with a modification in WO 2009/095854).

This junction temperature measurement system will first be outlined, and the reader is referred to 2009/095853 for further details.

The junction temperature measurement system provides a method (and apparatus) to measure the junction temperature of a LED with good accuracy by using square wave current pulses, in which the high level ($I_{high}$) is an operational current of the LED and the low level is a measurement current. By monitoring the forward voltage (Vf) of the LED over time, two dominant values will be found (if the operational current is constant over the monitoring period), one of which is representative of the real temperature at the LED junction during operation. A histogram of the forward voltage drops can be used for the data analysis, or else individual measurements can be taken.

FIGS. 2A to 2D are graphs will schematically represent the method.

Figures 2A, 2B, 2C:
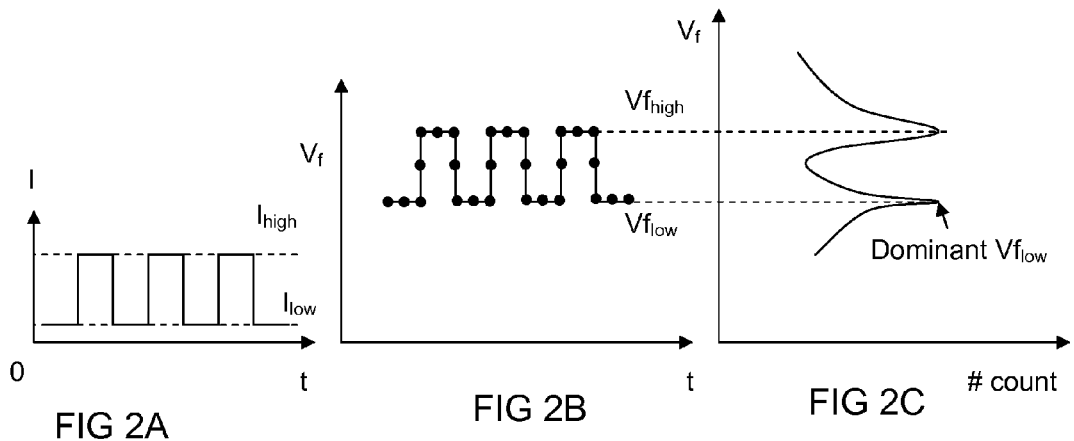
FIGS. 2A to 2D are graphs to explain a method of junction temperature measurement which is used by the method of the invention.
Figure 2D:

FIG. 2A shows the drive current applied to the LED. A pulsed current source is used to drive the LED. The pulses drive a forward bias current through the diode, and the current is in the form of a square wave which toggles between high and low current values.

The low current value is a measuring current, preferably smaller or equal to 1 mA. More preferably this current is less then 500 µA, more preferably less then 100 µA, even more preferably less then 50 µA and even more preferably less then 10 µA, for example in the region of 5 µA.

A low measurement current (for example less than 1 mA) is desired for two main reasons. Firstly, if a LED is driven at large current, the self-heating effect starts, which means a less accurate measurement is obtained. The self-heating effect has been found by the applicant to be significant above currents of 1 mA. The self-heating effect depends on the thermal design of the LED package, and is therefore different for different LED designs.

Secondly, the larger the current, the brighter the LED. In an application such as 2D dimming TV, the minimum light level emitted from the backlight should not be more than 1% of the maximum illumination level. This 2D dimming system is a backlight control method in which only parts of the backlight are illuminated so that improved contrast between bright and dark areas of an image can be obtained.

The desire for low light output for the measurement phase means that the lowest possible current is required, but the current needs to be sufficient for the LED to be forward biased so that the voltage can be measured.

These considerations will all be taken into account when selecting the measurement current, and the value will depend on the intended use of the LED, the thermal properties of the packaging, and the LED characteristics.

FIG. 2B shows the resulting forward bias voltage drop Vf across the diode.

In one example in WO 2009/095853 the forward bias voltage drop is sampled at regular intervals, and the sampling instants are shown as filled circles in the plot of FIG. 2B.

At each sampling instant, the voltage is measured, and a histogram counter monitors this LED voltage Vf, and determines the dominant value of voltage drop.

This is achieved by creating the histogram as shown in FIG. 2C. As shown, there are two peaks in the count number. The peak in the count number corresponding to the higher voltage drop derives from the drive current (as this has been shown as constant in FIG. 1A). The peak in the count number corresponding to the lower voltage drop derives from the measurement current, and this peak represents the forward bias voltage drop at the low current measurement value.

In WO 2009/095853, the LED junction temperature is determined by relating the dominant forward bias voltage drop corresponding to the measurement current with a calibrated curve or an analytical model of the relationship between forward bias voltage Vf and temperature T. This relationship is shown schematically in FIG. 2D. An analytical function is then used to define the relationship shown in FIG. 2D, giving very low memory requirement. In WO 2009/095853, this is used to enable a very smooth control of the LED light and colour output as well as an analogue (rather than discretised) solution to the required drive current.

The output flux of the LED is controlled by the high current value of the current drive sequence, as well as the pulse frequency and the duty cycle. However, the measurement current value is unchanged throughout the operation.

An advantage of measuring the voltage drop (and therefore temperature) at low current (for example less than 1 mA) is that in some applications, such as backlighting for an LCD panel, it enables a dimming operation to be implemented, where a fast dynamic response to a requirement for a light output change, and high contrast between light and dark, is required. The light output can be altered by changing the duty cycle of the current waveform, and the low measurement current results in very little light emission, so that good dark performance can be obtained.

This invention does not require actual estimation of the junction temperature. What is important is that analysis of the forward voltage takes account of the junction temperature, which in turn relates to how efficiently the input power is converted to light rather than heat. As the LED ages, the conversion to light is less efficient and the conversion to heat becomes more significant. Thus, monitoring the heating effect can be used to enable estimation of the state of ageing of the LED, and therefore the output flux.

Figure 3:
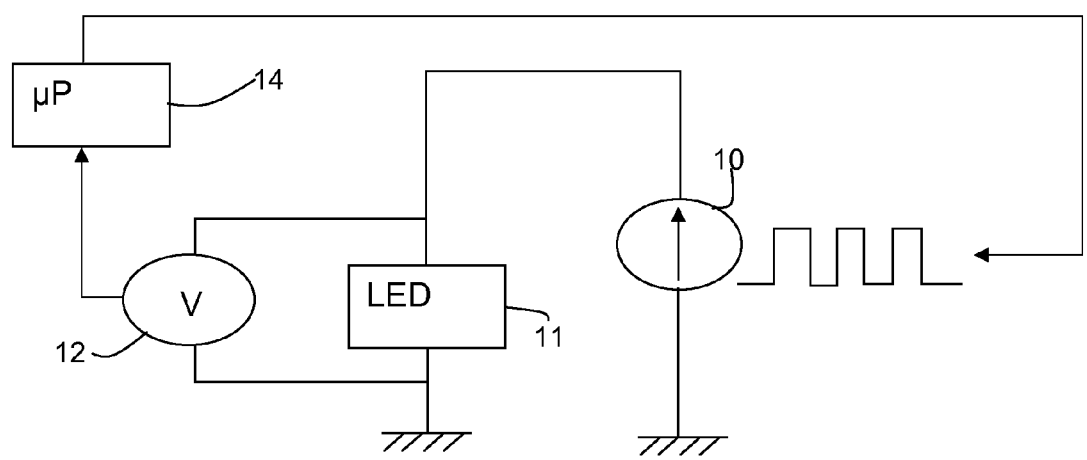
FIG. 3 shows the system for estimating the output light flux of the invention.

FIG. 3 shows a system for estimating the output light flux of an LED.

A current source circuit 10 is used for driving a forward bias current through the LED 11, and this current comprises the square wave described above. Any suitable current source circuit can be used for this purpose.

The forward bias voltage drop is sampled by a voltage measurement circuit 12, and the samples are provided to a processor 14. The processor 14 implements processing described further below.

Figure 4:
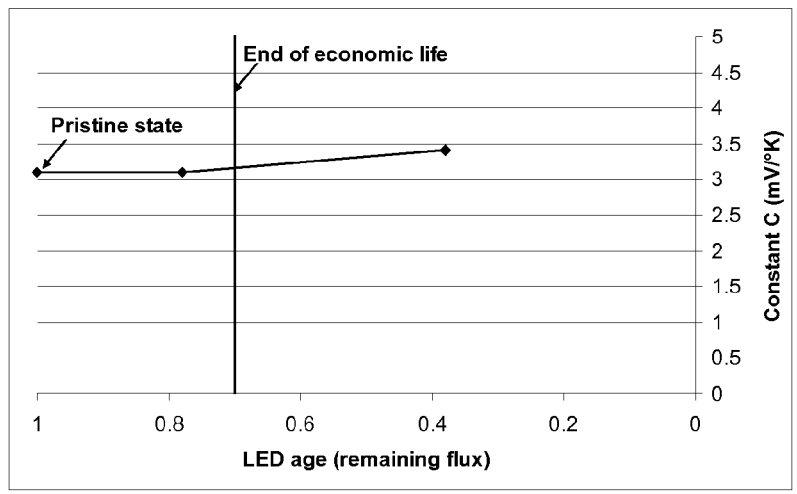
FIG. 4 shows how one parameter remains constant as the LED ages.

The junction temperature estimation method of WO 2009/095853 is essentially based on the temperature estimation from LED forward voltage, in particular using the equation:

$$\Delta T_{junction} = \frac{\Delta V_f}{C} \quad (1)$$

where C is found to be a constant. For example, at the measurement current of 10 μA a blue Luxeon K2 LED typically has C=3.1 mV/° K. This constant C has been found to change very little over the entire life of the LED as shown in FIG. 4, which plots the value C versus age.

This invention makes different use of the forward voltage analysis, although it is noted that the same system can also implement temperature compensation in the manner outlined in WO 2009/095853.

The total electrical power feed to a LED can be divided into the power that creates light ($P_{light}$) and power that heats up the LED junction resulting in the raised junction temperature ($P_{heat}$). At pristine state, the power balance of a LED can be expressed as:

$$P_{in\_pristine} = P_{light\_pristine} + P_{heat\_pristine} \quad (2)$$

$P_{in\_pristine}$ is the input power supplied to a new LED, of which $P_{light\_pristine}$ results in light output and $P_{heat\_pristine}$ results in heating.

The heating power can be defined as $P_{heat\_pristine} = H \cdot \Delta T_{junction\_pristine}$ and H is a constant that lumps all the thermal properties of the LED in connection with the surrounding environment. $\Delta T_{junction\_pristine}$ is the change in junction temperature for the new LED in response to current stressing.

At age A the power balance of the aged LED is as follows:

$$P_{in\_age} = P_{light\_age} + P_{heat\_age} \quad (3)$$

$P_{in\_age}$ is the input power supplied to the aged LED, of which $P_{light\_age}$ results in light output and $P_{heat\_age}$ results in heating.

The heating power can be defined as $P_{heat\_age} = H \cdot \Delta T_{junction\_age}$. $\Delta T_{junction\_age}$ is the change in junction temperature for the aged LED in response to current stressing. From equations 2 and 3, the part of electrical power that heats up the LED at age A can be expressed as:

$$P_{heat\_age} = P_{heat\_pristine} \cdot \frac{\Delta T_{junction\_age}}{\Delta T_{junction\_pristine}} \quad (4)$$

$$= P_{heat\_pristine} \cdot \frac{\Delta V_{f\_age}}{\Delta V_{f\_pristine}}$$

Note that the constant C has been cancelled as it is constant over ageing. Thus, this equation relies on the constant relationship between temperature and forward voltage. As a result, the fraction of electrical power that creates light when the LED is at age A can be calculated as:

$$P_{light\_age} = P_{in\_age} - P_{heat\_pristine} \cdot \frac{\Delta V_{f\_age}}{\Delta V_{f\_pristine}} \quad (5)$$

The output flux of the LED then can be determined as:

$$\Phi_{age} = \Phi_{pristine} \cdot \frac{P_{light\_age}}{P_{light\_pristine}} \quad (6)$$

From equation 6, it is clear that to calculate the light output of a LED at age A, this analysis requires knowledge of the LED performance at its pristine state. This can be done by a calibration step when the LED of interest is at pristine state. The parameters that need to be collected and stored are:

(1) the output flux at operating conditional $\Phi_{pristine}$;
(2) the $V_f$ differences between right after the stress pulse and at steady state of the LED at the measurement current; and
(3) the input electrical power to the LED related to the current pulse.

At a moment in the life of the LED, knowing the $V_f$ differences between right after the stress pulse and at steady state of the LED at the same measurement current and the input electrical power to the LED related to identical current pulse, it is then possible to calculate the remaining output flux of the LED.

Figure 5:
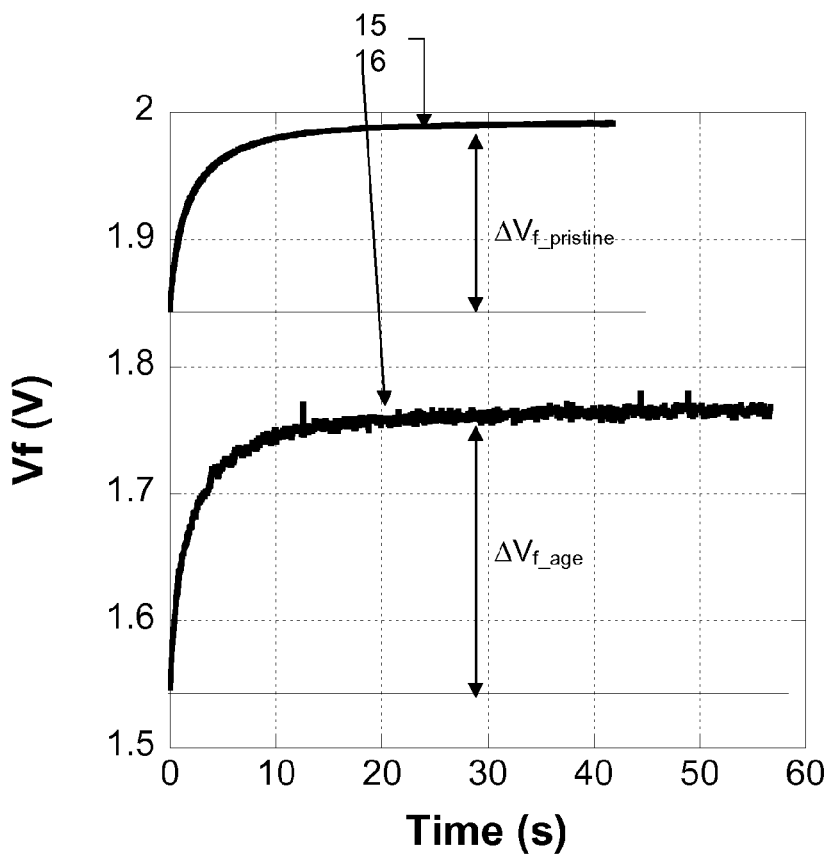
FIG. 5 shows how the forward voltage response to current stressing varies with ageing.

FIG. 5 shows the measured $V_f$ response to measurement current after stress current pulses of a LED at two different moments in its life. As can be seen, the $\Delta V_{f\_age}$ is substantially larger than the $\Delta V_{f\_pristine}$ indicating that after the same current pulse, the junction temperature of the aged LED is much higher than that when the LED was younger.

The value of Vf at the end of the current stressing pulse is used as a reference, and this corresponds to the stable Vf value before the current stressing pulse. This is because the thermal latency is much greater than the duration of the current stressing pulse. However, the Vf value can be measured on both sides of the stress pulse.

The low current before the stress pulse is held as long as necessary so that the forward voltage drop at the low current has stabilised. The change in the forward voltage over time can be monitored to determine when it has stabilised. For example, if the forward voltage drop of a blue LED at a measurement current of 10 µA is 2.4V, and a change in forward voltage of 3 mV corresponds to a 1 degree temperature change, then stabilisation to within 3 mV enables accuracy to 1 degree. This waiting time for stabilisation may be as long as 60 seconds.

FIG. 5 is for $V_f$ at a measurement current of 10 µA after identical stress current at two different moments in life of the LED. Plot 15 is for the new LED and plot 16 is for an aged LED. As shown in FIG. 5, the forward voltage stabilises after around 10 s indicating that the heating effect has been completed. The value of Vf will then drop over longer periods back to the baseline level.

The test is preferably carried out at room temperature, so that the same starting conditions apply. However, this is not essential, as the change in forward voltage is the important parameter, so that different starting values of the forward voltage can be tolerated (for example because of different ambient temperatures or device characteristics).

Figure 6:
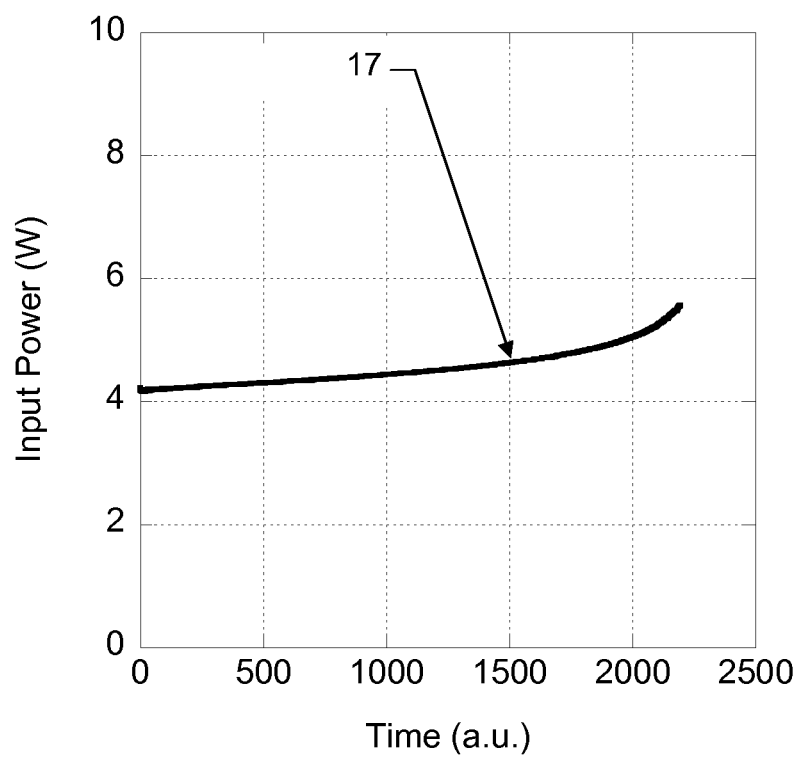
FIG. 6 shows how the input power drawn by the LED varies with ageing.

However, it is noteworthy that the input electrical power associated with identical current pulses also increases over time as the LED ages. FIG. 6 shows the evolution of input power 17 at constant feeding current to the LED over time. This contributes partly to the higher temperature of the LED junction after a current pulse. The other contribution to rising LED junction temperature is the changing balance between the power that goes into creating light and the power that heats up the LED.

In order to verify this method of LED flux estimation via electrical measurement directly to the LED, an experimental setup and testing sequence have been created.

Figure 7:
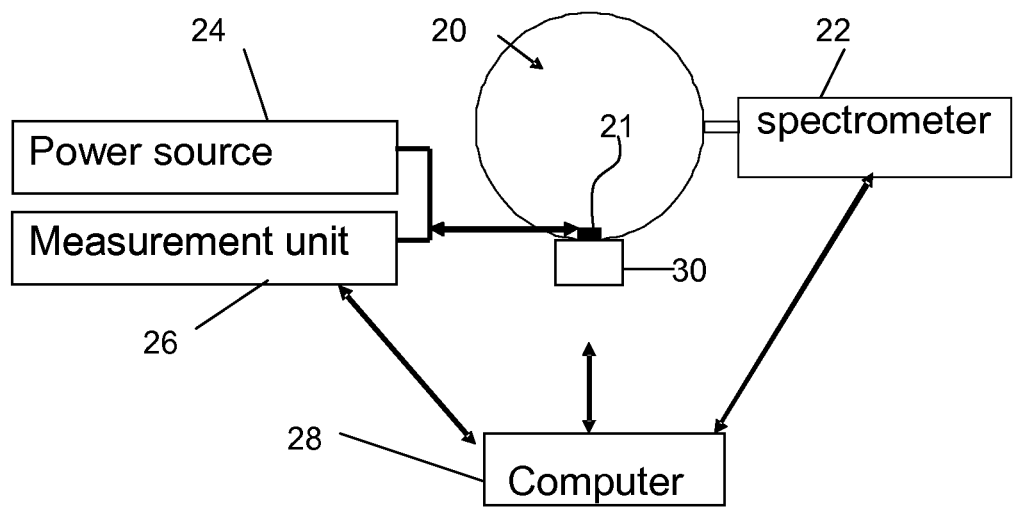
FIG. 7 shows a system for testing the method of the invention.
Figure 8:
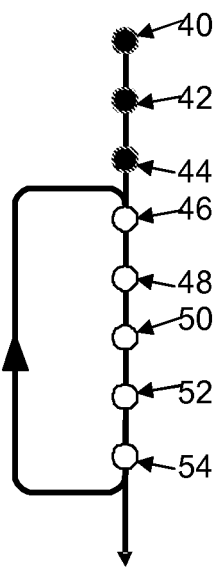
FIG. 8 shows a test sequence for testing the method of the invention.

This test setup is shown in FIG. 7, and FIG. 8 shows the test sequence. The method verifies the LED flux measurement method using only electrical data directly from the LED.

The arrangement of FIG. 7 comprises an integrating sphere for directing all light output from the LED 21 to an output at which a spectrometer 22 is provided. The LED is controlled by a power source 24 and a measurement unit 26 implements the forward voltage measurements. The system is under the control of a computer 28. A controllable thermal chuck is shown as 30.

The process of FIG. 8 comprises:
Step 40: waiting for a stable temperature;
Step 42: capturing the I-V curve for the pristine diode (i.e. the ΔVf analysis explained above);
Step 44: measuring the output light spectrum at the given operating current for the pristine diode.
Step 46: applying a stressing pulse, for example 2-3 A for a duration of 10 s;
Step 48: monitoring the cooling of the device based on the Vf measurements;
Step 50: waiting for a stable temperature;
Step 52: capturing the I-V curve for the now aged diode (i.e. the ΔVf analysis explained above);
Step 54: measuring the output light spectrum at the given operating current for the now aged diode.

Steps 46 to 54 are repeated to provide data for different degrees of ageing.

The long stressing pulse of 10 s is used to provide forced ageing of the device.

Figure 9:
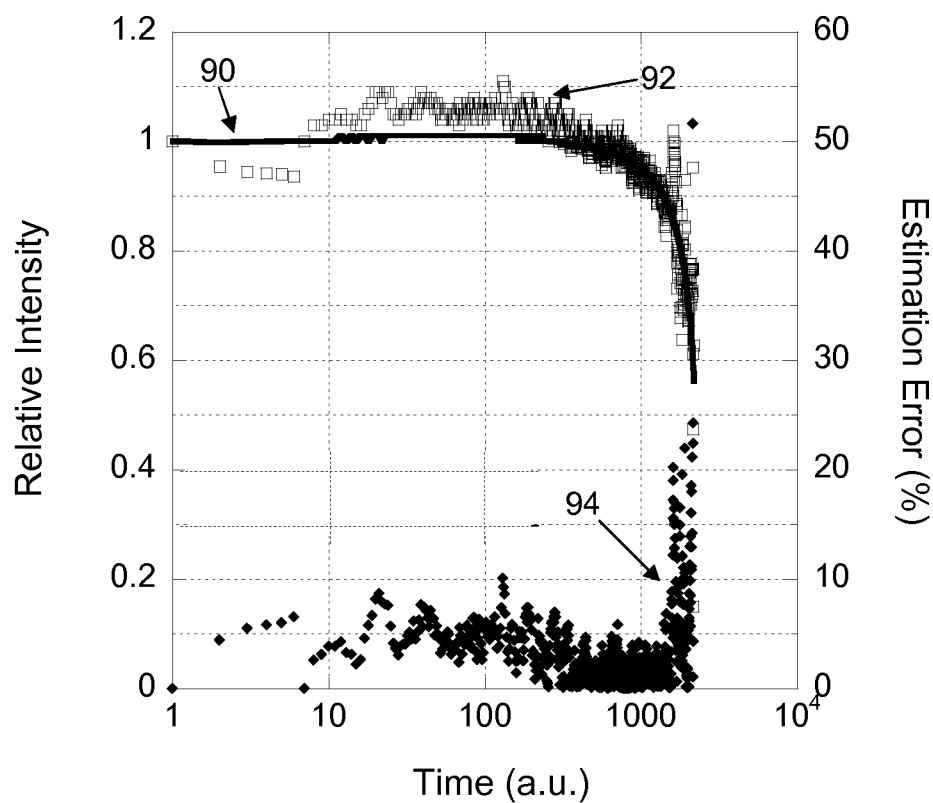
FIG. 9 shows the test results.

The result is shown in FIG. 9 which gives a comparison between real flux and estimated flux based on electrical data that come directly from the LED over its entire lifetime. The estimated flux of the tested LED over its lifetime (squares 90) is compared to the actual flux measured by the independent high resolution spectrometer (plot 92), and the estimation error is shown as plot 94.

As can be seen in FIG. 9, the output flux estimation based on electrical data from the LED is very accurate for most part of the useful lifetime of the LED (less than 10% of estimation error). At the end of the LED life, however, it is observed that the inaccuracy level of the estimation rises sharply. This can be expected, as when the LED is getting old, there is much more electrical noise recorded from the LED. For the majority of the useful lifetime of the LED, the method offers a good estimation of the LED output flux. Furthermore, with the smart implementation of measurement signal noise cancellation, the estimation accuracy can be greatly improved.

The invention thus provides a method to estimate the flux output of a LED at any moment in time in its operating life based solely on the electrical signals that directly come from the LED. Knowing the output flux of an LED is necessary in a lighting system using LEDs for light flux and colour control as well as maintenance planning Because the method is electrical-based and needs no extra optical sensor, it simplifies the system requirements, lowers the system cost and can be integrated in LED driver circuits.

The mathematical analysis above shows how the flux change relates to the way the forward voltage characteristics change with ageing. Of course, the relationship between ageing and the forward voltage could be derived by analysing the problem in a different way. Thus, the actual equations are not a unique solution to finding a relationship between forward voltage behaviour and the ageing of the LED, and thereby the output light flux performance. The invention relates generally to the monitoring of the forward voltage in response to a test signal, in order to estimate ageing and in turn determine the output characteristics. For example, the analysis may yield an age estimation, which is then mapped to output characteristics for example using an algorithm or look up table.

The junction temperature estimation method of WO2009/095853 can be carried out during operation, as it can use the normal operating cycle of the LED. The ageing estimation of the invention may require longer measurement time (both for the stabilisation of the low current and for the stressing pulse). Thus, although the same relationship between voltage and temperature is called upon, this invention typically requires a dedicated test sequence, for example at switch-on of the device or any other time that does not inconvenience the user.

The applications of this method range from home lighting, automotive lighting, architectural lighting, street lighting etc. Applications of this method are especially useful where regular maintenance of the lighting fixtures is not easy to carry out and/or when stringent safety requirement on the lighting fixture is requested.

Various modifications will be apparent to those skilled in the art.

The invention claimed is:

1. A method of estimating the output light flux of a light emitting diode, comprising:
    applying a drive current waveform to the LED over a period of time comprising a testing period;
    monitoring the forward voltage across (Vf) the LED during the testing period; and
    estimating the output light flux as a function of changes (ΔVf) in the forward voltage, wherein the drive current waveform comprises a first current portion ($I_{high}$) for current stressing the LED and a second current portion ($I_{low}$), wherein the forward voltage (Vf) is monitored during the second current portion, wherein the forward voltage (Vf) is measured at the beginning of the second current portion ($I_{low}$), after the end of the first current portion ($I_{high}$), and subsequently when the forward voltage (Vf) has stabilised during the second current portion, wherein the estimated output light flux is determined as:

$$\Phi_{age} = \Phi_{pristine} \cdot \frac{P_{light\_age}}{P_{light\_pristine}}$$

wherein $\Phi_{age}$ is the output flux after ageing, $\Phi_{pristine}$ is the output flux before ageing, $P_{light\_age}$ is the power supplied to the LED after ageing which results in light output rather than heating and $P_{light\_pristine}$ is the power supplied to the LED before ageing which results in light output rather than heating, and wherein $P_{light\_age}$ is obtained from:

$$P_{light\_age} = P_{in\_age} - P_{heat\_pristine} \cdot \frac{\Delta V_{f\_age}}{\Delta V_{f\_pristine}}$$

wherein $P_{in\_age}$ the total input power, $P_{heat\_pristine}$ is the power supplied to the LED before ageing which results in heating rather than light, $\Delta V_{f\_age}$ is the difference in measured forward voltage before and after the first current portion and after ageing, and $\Delta V_{f\_pristine}$ is the difference in measured forward voltage before and after first current portion and before ageing.

2. A method as claimed in claim 1, further comprising determining the output light flux before ageing, and using the determined output light flux in the estimation of the output light flux as a function of changes in the forward voltage.

3. A method as claimed in claim 1, further comprising determining the electrical power applied to the LED during the testing period and using the determined electrical power in the estimation of the output light flux as a function of changes in the forward voltage.

4. A method as claimed in claim 1, wherein the second current portion is less than or equal to 1 mA.

5. A method as claimed in claim 1, wherein the drive current waveform comprises a square wave which toggles between a first current value and a second current value, wherein the second current value is held during the testing period for a time sufficient for the forward voltage to stabilise.

6. A system for estimating the junction temperature of a light emitting diode, comprising:
    means for applying a drive current waveform to the LED over a period of time comprising a testing period;
    means for monitoring the forward voltage across the LED during the testing period; and
    means for estimating the output light flux as a function of changes in the forward voltage, wherein the drive current waveform comprises a first current portion ($I_{high}$) for current stressing the LED and a second current portion ($I_{low}$), wherein the means for monitoring is for monitoring the forward voltage during the second current portion, wherein the means for monitoring is for measuring the forward voltage at the beginning of the second current portion ($I_{low}$), after the end of the first current portion ($I_{high}$), and subsequently when the forward voltage (Vf) has stabilised during the second current portion, wherein the means for estimating the output light flux is for determining the light output flux as:

$$\Phi_{age} = \Phi_{pristine} \cdot \frac{P_{light\_age}}{P_{light\_pristine}}$$

wherein $\Phi_{age}$ is the output flux after ageing, $\Phi_{pristine}$ is the output flux before ageing, $P_{light\_age}$ is the power supplied to the LED after ageing which results in light output rather than heating and $P_{light\_pristine}$ is the power supplied to the LED before ageing which results in light output rather than heating, and wherein $P_{light\_age}$ is obtained from:

$$P_{light\_age} = P_{in\_age} - P_{heat\_pristine} \cdot \frac{\Delta V_{f\_age}}{\Delta V_{f\_pristine}}$$

wherein $P_{in\_age}$ the total input power, $P_{heat\_pristine}$ is the power supplied to the LED before ageing which results in heating rather than light, $\Delta V_{f\_age}$ is the difference in measured forward voltage before and after the first current portion and after ageing, and $\Delta V_{f\_pristine}$ is the difference in measured forward voltage before and after the first current portion and before ageing.

7. An LED control system comprising:
a system for estimating the output light flux as claimed in claim 6; and an LED drive circuit for driving the LED in dependence on the estimated output light flux temperature.

* * * * *